(12) United States Patent
Tseng

(10) Patent No.: US 6,284,653 B1
(45) Date of Patent: Sep. 4, 2001

(54) METHOD OF SELECTIVELY FORMING A BARRIER LAYER FROM A DIRECTIONALLY DEPOSITED METAL LAYER

(75) Inventor: Horng-Huei Tseng, Hsin-Chu (TW)

(73) Assignee: Vanguard International Semiconductor Corp., Hsin-chu (TW)

( * ) Notice: Subject to any disclaimer, the term of this patent is extended or adjusted under 35 U.S.C. 154(b) by 0 days.

(21) Appl. No.: 09/697,948

(22) Filed: Oct. 30, 2000

(51) Int. Cl.$^7$ .................................................. H01L 21/44
(52) U.S. Cl. ......................... 438/653; 438/654; 438/656
(58) Field of Search .................................. 438/692, 687, 438/633, 693, 754, 756, 757, 697, 700, 653, 654, 643, 644, 688; 257/739, 740, 751–753, 763, 764, 774

(56) References Cited

U.S. PATENT DOCUMENTS

| | | | |
|---|---|---|---|
| 5,552,340 | 9/1996 | Lee et al. ............................ | 437/190 |
| 5,571,572 | * 11/1996 | Snadhu et al. ..................... | 427/585 |
| 5,882,399 | * 3/1999 | Ngan et al. ......................... | 438/656 |
| 5,962,933 | * 10/1999 | Xu et al. ............................. | 257/750 |
| 5,966,607 | * 10/1999 | Chee et al. ......................... | 438/305 |
| 5,985,789 | * 11/1999 | Kim et al. ........................... | 438/653 |
| 6,025,274 | * 2/2000 | Lin et al. ............................ | 438/721 |
| 6,054,379 | * 4/2000 | Yan et al. ........................... | 438/623 |
| 6,140,241 | * 10/2000 | Shue et al. ......................... | 438/692 |

* cited by examiner

Primary Examiner—Michael Lebentritt
(74) Attorney, Agent, or Firm—George O. Saile; Stephen B. Ackerman

(57) ABSTRACT

A process for forming a composite structure, comprised of an overlying titanium nitride barrier layer, and an underlying titanium disilicide layer, located on a portion of a conductive region in a semiconductor substrate exposed at the bottom of a high aspect ratio contact hole, has been developed. A first iteration of this invention entails the deposition of a titanium ion layer, via an anisotropic, ion metal plasma (IMP), procedure, on the exposed portion of the conductive region, as well as on the top surface of the insulator layer in which the high aspect ratio contact hole was formed in. A first anneal cycle results in the formation of a titanium disilicide layer on the conductive region, leaving an unreacted titanium ion layer on the surface of the insulator layer. After removal of unreacted titanium, a second anneal cycle is performed in a nitrogen containing ambient, converting a top portion of the titanium disilicide layer to a titanium nitride barrier layer. A tungsten plug structure is then formed on titanium nitride-titanium disilicide layer, in the high aspect ratio contact hole. A second iteration of this invention features IMP deposition of the titanium ion layer on the exposed conductive region, at the bottom of the contact hole, as well as on the top surface of the photoresist shape used for definition of the high aspect ratio contact hole. After removal of the photoresist shape, and of the titanium ion layer located on the top surface of the photoresist shape, subsequent anneal cycles are performed resulting in the desired composite, titanium nitride-titanium disilicide structure, on the conductive region.

20 Claims, 5 Drawing Sheets

METHOD OF SELECTIVELY FORMING A BARRIER LAYER FROM A DIRECTIONALLY DEPOSITED METAL LAYER

BACKGROUND OF THE INVENTION

(1) Field of the Invention

The present invention relates to methods used to form semiconductor devices, and more specifically to a method used to form a composite structure comprised of a barrier layer on an underlying metal silicide layer, with the composite structure located at the bottom of a contact hole opening, and formed prior to formation of a metal plug structure in the contact hole opening.

(2) Description of Prior Art

The use of metal silicide layers on specific semiconductor conductive regions, such as gate structures, or source/drain regions, have resulted in decreased word line, and bit line resistance, allowing increased metal oxide semiconductor field effect transistor (MOSFET), device performance to be realized. The formation of metal silicide layers can in most cases be performed using self-alignment procedure, in which a metal layer is blanket deposited, then annealed to form the desired metal silicide layer on regions in which the metal layer resided on underlying conductive regions such as on polysilicon gate structures, and on silicon source/drain regions, located adjacent to the polysilicon gate structure. Unreacted metal, located on non-conductive regions, such as insulator spacers on the sides of the polysilicon gate structure, is then selectively removed resulting in the metal silicide layers, self aligned on underlying conductive regions.

The metal layer, used for metal silicide, is usually obtained via plasma vapor deposition (PVD), procedures, conformally deposited on the non-severe topographies offered by gate structures and adjacent source/drain regions. However in some cases metal silicide layers have to be formed on conductive regions located at the bottom of high aspect ratio contact holes. The narrow diameter, and depth of the high aspect ratio contact hole, present a difficult topography for the PVD metal to contour. The ability to deposit the desired thickness of metal on the conductive region exposed at the bottom of the high aspect ratio contact hole can however be increased via use of a more directional metal deposition procedure. Therefore this invention will describe a method of directionally depositing a metal layer on a conductive region located at the bottom of a high aspect ratio contact hole, excluding deposition on the sides of the high aspect ratio contact hole. Subsequent anneal cycles, performed in specific ambients, result in the formation of the desired metal silicide layer on the underlying conductive region, and result in the selective formation of the desired a barrier layer, located on the newly formed metal silicide layer. Prior art such as Lee et al, in U.S. Pat. No. 5,552,340, describe a method of forming a barrier layer on an underlying metal silicide layer, which is located on a conductive region exposed at the bottom of a contact hole opening. However that prior art, unlike the present invention in which the barrier layer is selectively formed only on metal silicide layers, deposits the barrier layer, resulting in barrier layer located on the sides of the contact hole, thus decreasing the space available in the contact hole for a subsequent conductive plug structure.

SUMMARY OF THE INVENTION

It is an object of this invention to form a metal silicide layer on a portion of a conductive region in a semiconductor substrate, exposed in a high aspect ratio contact hole, then to selectively form a barrier layer on the metal silicide, via an anneal procedure performed in a nitrogen containing ambient.

It is another object of this invention to supply the metal, for the metal silicide layer, using a ion metal plasma (IMP), procedure, resulting in metal ions being deposited only on the top surface of the conductive region exposed in the high aspect ratio contact hole, and only on the top surface of the insulator layer in which the high aspect ratio contact hole was defined in, without deposition of metal ions on the sides of the high aspect ratio contact hole.

It is still another object of this invention to deposit metal ions via an IMP procedure, only on the top surface of the conductive region exposed in the high aspect ratio contact hole, and only on the top surface of the photoresist shape, used to define the high aspect ratio contact hole, and after selective formation of a barrier layer, remove the unwanted regions of barrier layer from the top surface of the photoresist shape via a lift-off process.

In accordance with the present invention a method of forming a metal silicide layer on a portion of conductive region exposed at the bottom of a high aspect ratio contact hole, followed by selective formation of a barrier layer, on the underlying metal silicide layer, is described. A first iteration entails deposition of metal layer, comprised of metal ions, obtained via an anisotropic, ion metal plasma (IMP), procedure, with the metal ion layer deposited only on the portion of conductive region exposed at the bottom of a high aspect ratio contact, and only on the top surface of the insulator layer in which the high aspect ratio contact hole was defined in. After a first anneal cycle, used to form a metal silicide layer on the exposed conductive region, the unreacted, metal ion layer is selectively removed from the top surface of insulator layer. A second anneal procedure is next performed in a nitrogen containing ambient to convert a top portion of the metal silicide layer to a barrier layer. A conductive plug structure is then formed, filling the high aspect ratio contact hole, and overlying the barrier layer-metal silicide structure, in the high aspect ratio contact hole.

A second iteration features the deposition of the metal ion layer, via the anisotropic IMP procedure, on the portion of conductive region exposed at the bottom of the high aspect ratio contact hole, and on the top surface of the photoresist shape used to define the high aspect ratio contact hole, in an underlying insulator layer. After removal of the photoresist shape, including the lifting off of the metal ion layer on the top surface of the photoresist shape, a first anneal cycle is performed to create a metal silicide layer on the exposed conductive region, consuming the entire metal ion layer previously located on the conductive region. A second anneal procedure, performed in a nitrogen containing ambient, converts a top portion of the metal silicide layer, located on the conductive region, to a barrier layer, resulting in a composite structure of a barrier layer-metal silicide layer, located on the portion of the conductive region exposed at the bottom of the high aspect ratio contact hole. A conductive plug structure is again formed, filling the high aspect ratio contact hole, and overlying the barrier layer-metal silicide structure, in the high aspect ratio contact hole.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
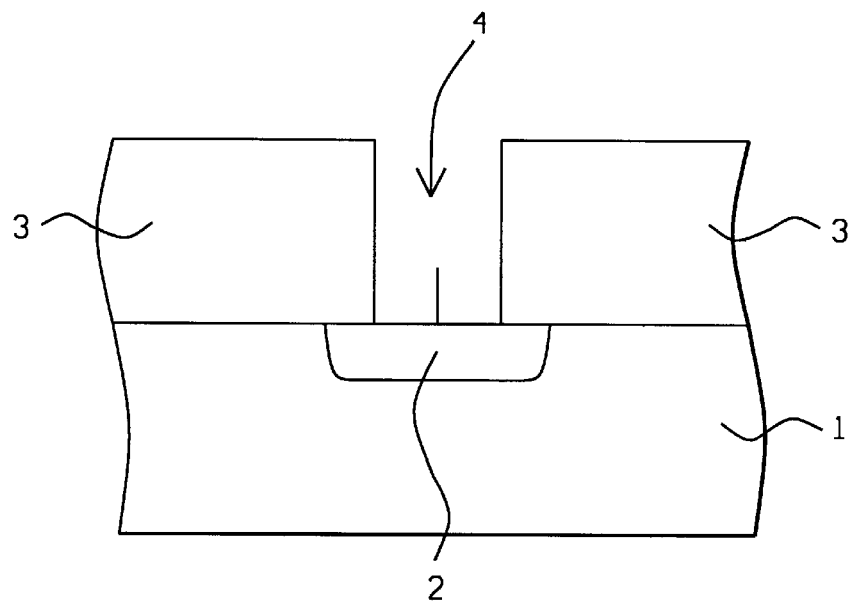
FIGS. 1–6, which schematically, in cross-sectional style, show key stages of fabrication used to selectively form a barrier layer-metal silicide layer, on a portion of a conductive region in a semiconductor substrate, exposed at the bottom of a high aspect ratio contact hole, featuring a metal silicide layer formed from a metal layer which is obtained via a ion metal plasma (IMP), procedure.

The method of selectively forming a barrier layer on a metal silicide layer located on a portion of a conductive region in a semiconductor substrate exposed at the bottom of a high aspect ratio contact hole, and featuring a metal layer, used to supply the metal component of the metal silicide layer, obtained via an anisotropic, ion metal plasma (IMP), procedure, will now be described in detail. A semiconductor substrate 1, comprised of P type, single crystalline silicon, with a <100>crystallographic orientation, is used and schematically shown in FIG. 1. A conductive region 2, such as an N type source/drain region of metal oxide semiconductor field effect transistor (MOSFET), with a surface concentration between about 1E18 to 1E21 atoms/cm$^3$ is formed in semiconductor substrate 1, followed by deposition of insulator layer 3, comprised of silicon oxide, or borophosphosilicate glass (BPSG). Insulator layer 3, is obtained via low pressure chemical vapor deposition (LPCVD), or plasma enhanced chemical vapor deposition (PECVD), procedures, at a thickness between about 3000 to 12000 Angstroms. A photoresist shape, not shown in the drawings, is used as a mask to allow an anisotropic, reactive ion etching (RIE), procedure, using $CHF_3$ as an etchant, to define contact hole 4, in insulator layer 3, exposing a portion of the top surface of conductive region 2. The diameter of contact hole 4, is between about 0.05 to 1.0 um, resulting in an aspect ratio for contact hole 4, between about 2 to 10. The result of forming the high aspect ratio contact hole is schematically shown in FIG. 1. In the first iteration of this invention the photoresist shape, used for definition of high aspect ratio contact hole 4, is removed via plasma oxygen ashing and careful wet cleans.

Figure 2:
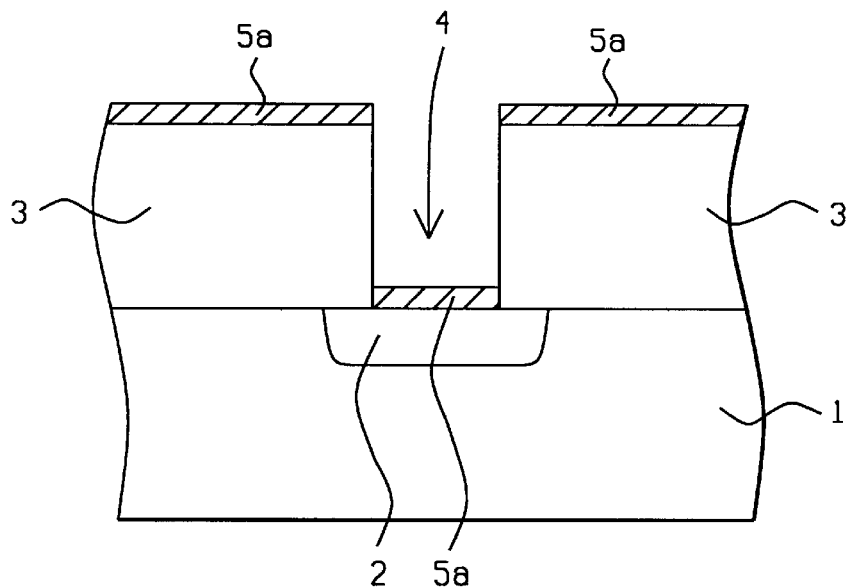

To successfully place a metal layer, needed for formation of a desired metal silicide layer, only on a portion of conductive region 2, exposed at the bottom of high aspect ratio contact hole 4, a directional metal deposition procedure is needed. Therefore a directional, ion metal plasma (IMP), procedure, is employed. The IMP procedure results in metal ions being directed anisotropically to a negatively biased semiconductor surface. The negative bias supplied to the apparatus used to hold the samples, results in the anisotropic deposition of positively ionized metal ions, on conductive region 2, exposed at the bottom of high aspect ratio contact hole 4, as well as on the top surface of insulator layer 3. Deposition on the sides of high aspect ratio contact hole 4, does not occur. The directionally deposited metal ions, such as titanium ions, result in metal ion layer 5a, such as a titanium ion layer, formed on the exposed portion of conductive region 2, as well as on the top surface of insulator layer 3, at a thickness between about 50 to 1000 Angstroms. Metal ion layer 5a, can also be comprised of nickel, cobalt, or tantalum ions. The result of the IMP procedure is schematically shown in FIG. 2.

Figure 3:
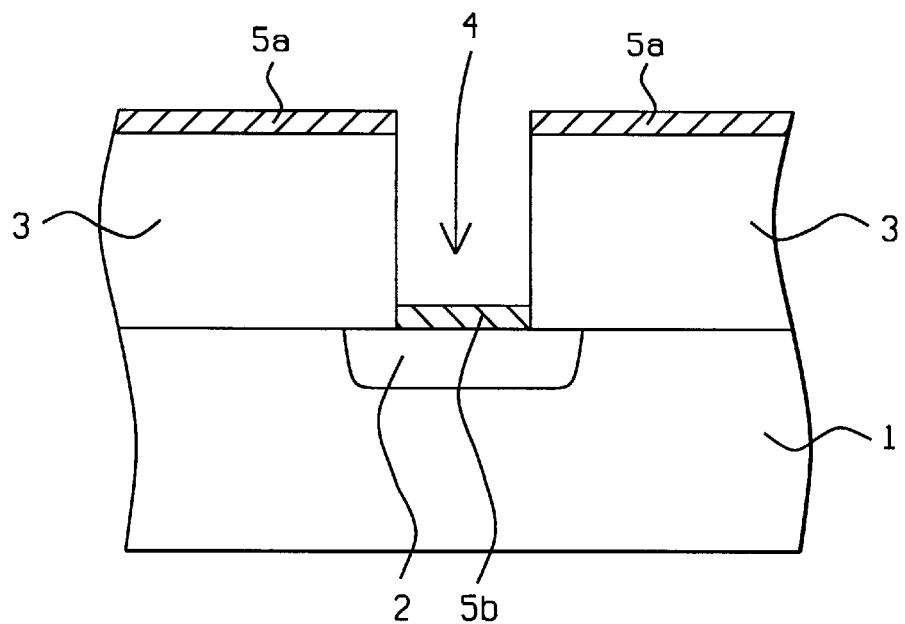
Figure 4:
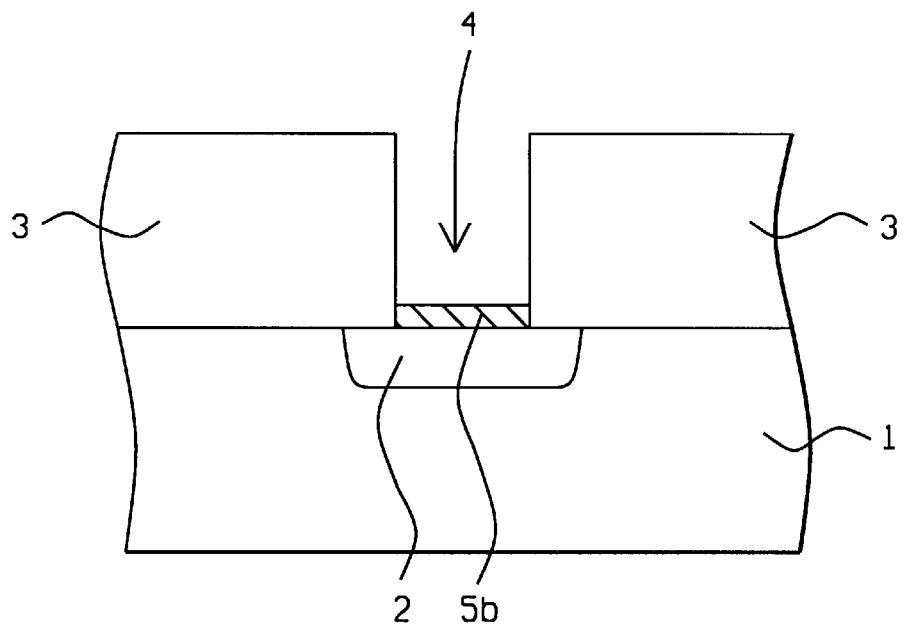

A first anneal procedure is next performed either in a conventional firnace, or in a rapid thermal anneal (RTA), furnace, at a temperature between about 600 to 900° C., resulting in the formation of metal silicide, or titanium disilicide layer 5b, at a thickness between about 100 to 500 Angstroms, on exposed portions of conductive region 2, while metal ion layer, or titanium ion layer 5a, located on the top surface of insulator layer 3, remains unreacted. The result of this procedure is schematically shown in FIG. 3. Selective removal of metal ion layer 5a, from the top surface of insulator layer 3, is then performed using a solution comprised of $H_2O_2$—$H_2O$—$NH_4OH$. This is shown schematically in FIG. 4.

Figure 5:
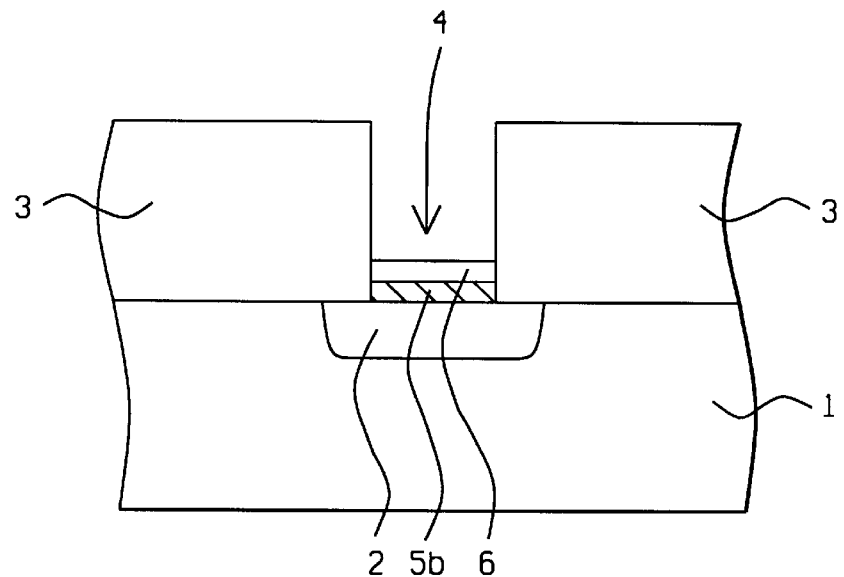

A second anneal procedure is next employed, again performed in either a conventional, or RTA furnace, at a temperature between about 600 to 900° C., however using a nitrogen containing ambient, such as nitrogen, NO, $N_2O$, or $NH_3$. The result of this anneal, in the nitrogen containing ambient, results in the selective formation of barrier layer, or titanium nitride layer 6, at a thickness between about 20 to 200 Angstroms, on the top surface of metal silicide layer 5b. The thickness of metal silicide layer 5b, has been reduced as a result of formation of barrier layer 6. This is schematically shown in FIG. 5.

Figure 6:
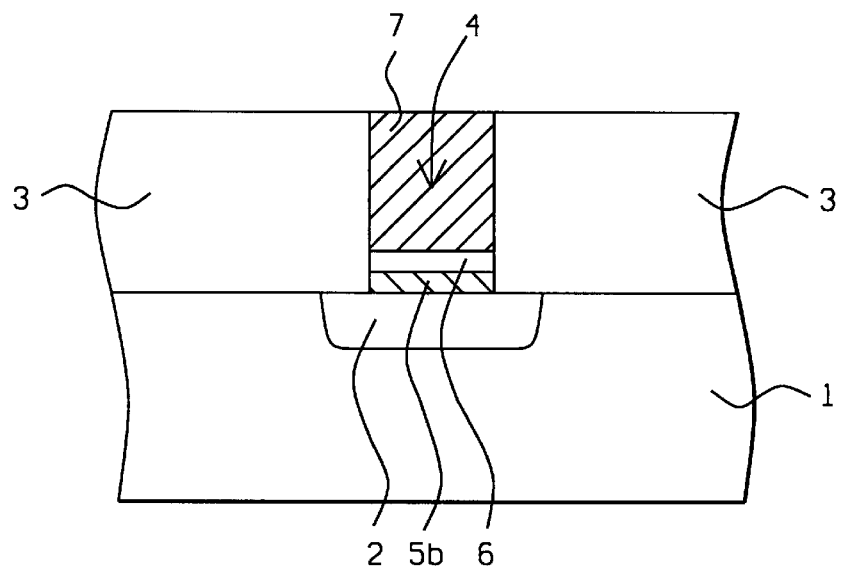

A conductive layer such as tungsten, is next deposited via LPCVD procedures, at a thickness between about 1000 to 5000 Angstroms, using tungsten hexafluoride as a source, completely filling high aspect ratio contact hole 4. Barrier layer 6, protects metal silicide layer 5b, from the reactants, and from reaction by-products, formed during deposition of the conductive metal layer. Removal of portions of the conductive metal layer, from the top surface of insulator layer 3, is accomplished via a chemical mechanical polishing (CMP), procedure, or via a selective RIE procedure, using either $Cl_2$ or $SF_6$ as an etchant for the conductive metal layer. This results in the formation of conductive metal, or tungsten plug structure 7, shown schematically in FIG. 6, in high aspect ratio contact hole 4, overlying, and contacting, the top surface of the barrier layer 6 metal silicide layer 5b, composite structure, located on the portion of conductive region 2, exposed at the bottom of high aspect ratio contact hole 4. The ability to directionally deposit metal at the bottom of, and not on the sides of, a high aspect ratio contact hole, allowed a wider diameter conductive plug structure to be realized, thus offering increased conductivity, and performance, when compared to counterpart, conductive plug structures, formed in high aspect ratio contact holes that were narrowed as a result of formation of metal, or barrier layers, on the sides of the high aspect ratio contact holes. An metal interconnect structure, not shown in the drawings, is then formed, overlying and contacting, conductive plug structure 7.

Figure 7:
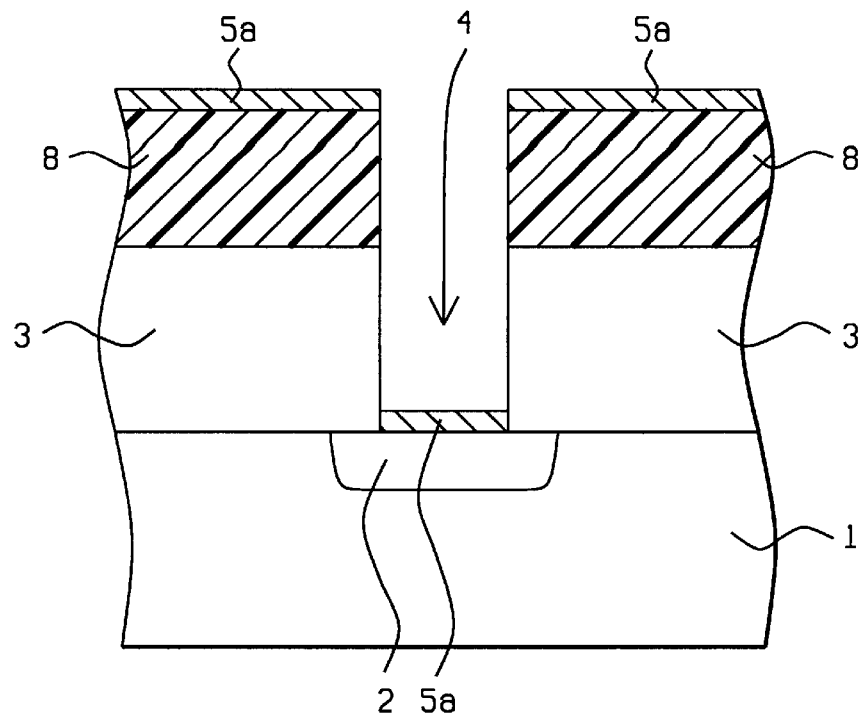
FIGS. 7–10 which schematically, in cross-sectional style, show key stages of fabrication used to selectively form a barrier layer-metal silicide composite structure, on a portion of a conductive region in a semiconductor substrate exposed at the bottom of a high aspect ratio contact hole, featuring the selective removal of a metal ion layer from the top surface of the photoresist shape used to define the high aspect ratio contact hole in an insulator, via a lift-off procedure.
Figure 8:
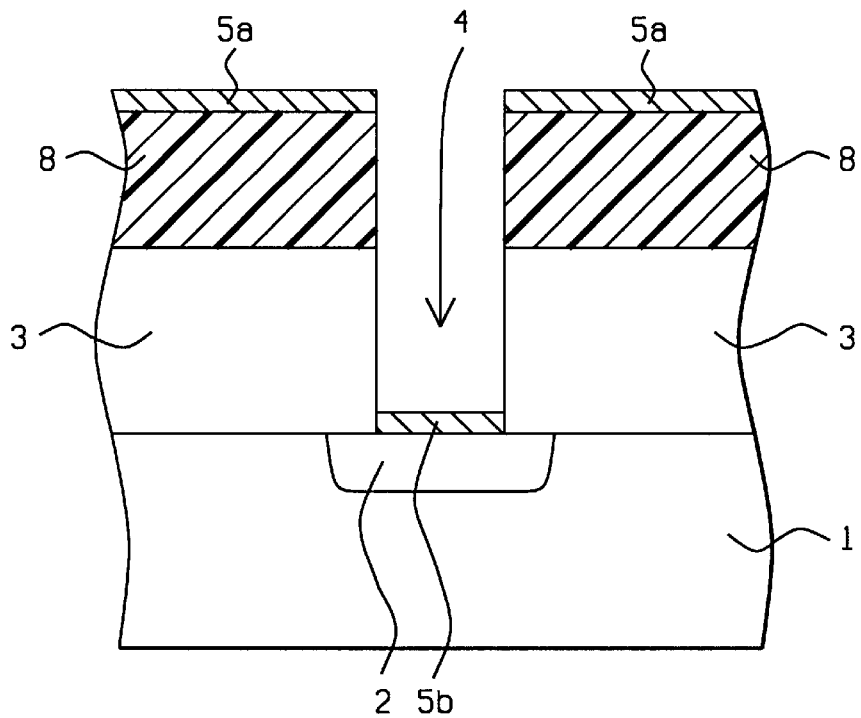

A second iteration of this invention is next described, and schematically shown using FIGS. 7–10. Photoresist shape 8, used to define high aspect ratio contact hole 4, remains during the IMP procedure, previously described in the first embodiment of this invention, resulting in the anisotropic, deposition of metal ion layer, or titanium ion layer 5a, on the portion of conductive region 2, exposed at the bottom of high aspect ratio contact hole 4, as well as on the top surface of photoresist shape 8. Metal ion layer 5a, which can also be comprised of nickel, cobalt, or tantalum ions, at a thickness between about 50 to 1000 Angstroms, is schematically shown in FIG. 7. Removal of photoresist layer 8, via use of an organic solution is next performed, with the portion of metal ion layer 5a, located on the top surface of photoresist shape 8, lifted off during the wet photoresist removal procedure. This is schematically shown in FIG. 8.

Figure 9:
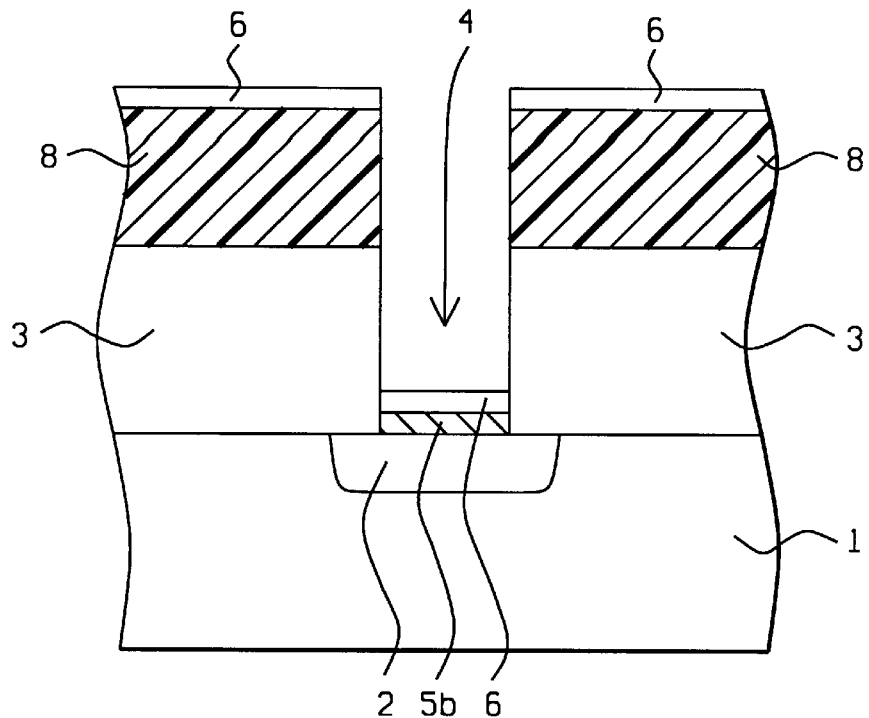
Figure 10:
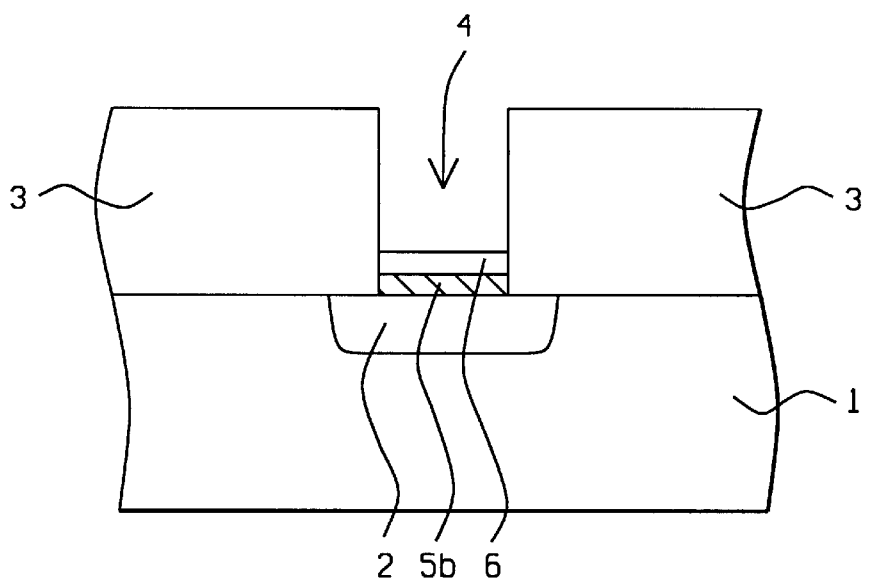

A first anneal procedure, again accomplished in either a conventional, or RTA furnace, is next performed at a temperature between about 600 to 900° C., resulting in the formation of metal silicide, or titanium disilicide layer 5b, at a thickness between about 100 to 500 Angstroms, on conductive region 2. This is schematically shown in FIG. 9. A second anneal procedure is next employed, again performed in either a conventional, or RTA furnace, at a temperature between about 600 to 900° C., however using a nitrogen containing ambient, such as nitrogen, NO, $N_2O$, or $NH_3$. The result of this anneal, in the nitrogen containing ambient, results in the selective formation of barrier layer, or titanium nitride layer 6, at a thickness between about 20 to 200 Angstroms, on the top surface of metal silicide layer 5b. The thickness of metal silicide layer 5b, has been reduced as a result of formation of barrier layer 6. The result of this procedure is schematically shown in FIG. 10. The sequence of process steps described in the second iteration of this invention, again results in a barrier layer-metal silicide composite structure, only at the bottom of a high aspect ratio contact hole, therefore not occupying volume at the sides of the high aspect ratio contact hole, and therefore allowing a subsequent conductive plug structure to fill the entire width of the high aspect ratio contact hole. Formation of a conductive plug structure, completely filling high aspect ratio contact hole 4, is then addressed using procedures identical to procedures previously used for the first iteration of this invention. Barrier layer 6, selectively formed, and located only on the top surface of metal silicide layer 5b, again protects the metal silicide layer from the reactants and by-products presented during the conductive metal layer deposition. The conductive plug structure, and an overlying, metal interconnect structure, are not shown in the drawings.

While this invention has been particularly shown and described with reference to, the preferred embodiments thereof, it will be understood by those skilled in the art that various changes in form and details may be made without departing from the spirit and scope of this invention.

What is claimed is:

1. A method of forming a metal silicide layer, and an overlying barrier layer, on a portion of a conductive region in a semiconductor substrate, exposed at the bottom of a contact hole, comprising the steps of:

providing said conductive region, in said semiconductor substrate;

depositing an insulator layer;

opening a contact hole in said insulator layer, exposing said portion of top surface of said conductive region, located at the bottom of said contact hole;

performing an anisotropic, ion metal plasma (IMP), deposition procedure, depositing a first metal ion layer on said portion of said conductive region, exposed at the bottom of said contact hole, and depositing a second metal ion layer on the top surface of said insulator layer;

performing a first anneal procedure to form said metal silicide layer from said first metal ion layer, on said portion of said conductive region exposed at the bottom of said contact hole, while said second metal ion layer, located on said insulator layer, remains unreacted;

selectively removing said second metal ion layer from the top surface of said insulator layer;

performing a second anneal procedure in a nitrogen containing ambient, to convert a top portion of said metal silicide layer to a barrier layer, resulting in a composite structure on said portion of said conductive region exposed at the bottom of said contact hole, with said composite structure comprised of said barrier layer on a bottom portion of said metal silicide layer;

forming a metal plug structure in said contact hole, overlying and contacting said composite structure; and forming a metal interconnect structure, overlying and contacting top surface of said metal plug structure.

2. The method of claim 1, wherein said insulator layer is a silicon oxide layer, or a boro-phosphosilicate glass layer, obtained via LPCVD or PECVD procedures at a thickness between about 3000 to 12000 Angstroms.

3. The method of claim 1, wherein diameter of said contact hole is between about 0.05 to 1.0 um, resulting in an aspect ratio for said contact hole between about 2 to 10.

4. The method of claim 1, wherein said anisotropic, IMP deposition procedure is performed with a negative bias applied to said semiconductor substrate.

5. The method of claim 1, wherein said first metal ion layer, and said second metal ion layer, are comprised of titanium, at a thickness between about 50 to 1000 Angstroms.

6. The method of claim 1, wherein said first anneal procedure, used to form said metal silicide layer, is performed at a temperature between about 600 to 900° C., in a conventional furnace or in a rapid thermal anneal furnace.

7. The method of claim 1, wherein said metal silicide layer is a titanium disilicide layer.

8. The method of claim 1, wherein said second anneal procedure, used to form said barrier layer, is performed in a conventional furnace, or an RTA furnace, at a temperature between about 600 to 900° C.

9. The method of claim 1, wherein said second anneal procedure is performed in a nitrogen containing ambient, comprised of either $N_2$, NO, $N_2O$, or $NH_3$.

10. The method of claim 1, wherein said barrier layer is a titanium nitride layer.

11. The method of claim 1, wherein said metal plug structure is comprised from a tungsten layer, obtained via LPCVD procedures at a thickness between about 1000 to 5000 Angstroms.

12. The method of claim 1, wherein definition of said metal plug is accomplished via a chemical mechanical polishing procedure, or via a selective RIE procedure, using $Cl_2$ or $SF_6$ as an etchant for tungsten.

13. A method of selectively forming a composite structure, comprised of a titanium nitride barrier layer on a titanium disilicide layer, located on a portion of a conductive region in a semiconductor substrate exposed at the bottom of a high aspect ratio contact hole, and featuring a photoresist lift-off procedure used to remove unwanted portions of a metal ion layer, comprising the steps of:

providing said conductive region in said semiconductor substrate;

depositing an insulator layer;

performing an anisotropic dry etch procedure, using a photoresist shape as an etch mask, to form said high aspect ratio contact hole in said insulator layer, exposing a portion of the top surface of said conductive region, located at the bottom of said high aspect ratio contact hole;

performing an anisotropic, ion metal plasma (IMP), procedure, depositing a first titanium ion layer on the portion of said conductive region exposed at the bottom of said high aspect ratio contact hole, and depositing a second titanium ion layer on the top surface of said photoresist shape;

removing said photoresist shape, and lifting off said second titanium ion layer during a photoresist removal procedure;

performing a first anneal procedure to form said titanium disilicide layer from said first titanium ion layer, on the portion of said conductive region exposed at the bottom of said high aspect ratio contact hole;

performing a second anneal procedure in a nitrogen containing ambient, to convert a top portion of said titanium disilicide layer to a first titanium nitride barrier layer, resulting in said composite structure located on the portion of said conductive region exposed at the bottom of said high aspect ratio contact hole, with said composite structure comprised of said first titanium nitride barrier layer on a bottom portion of said titanium disilicide layer;

forming a tungsten plug structure in said high aspect ratio contact hole, overlying and contacting said composite structure; and forming a metal interconnect structure, overlying and contacting said tungsten plug structure.

14. The method of claim 13, wherein said insulator layer is a silicon oxide layer, or a boro-phosphosilicate glass layer, obtained via LPCVD or PECVD procedures at a thickness between about 3000 to 12000 Angstroms.

15. The method of claim 13, wherein diameter of said high aspect ratio contact hole is between about 0.05 to 1.0 um, resulting in an aspect ratio between about 2 and 10.

16. The method of claim 13, wherein said anisotropic, IMP deposition procedure is performed with a negative bias applied to said semiconductor substrate.

17. The method of claim 13, wherein said first titanium ion layer, and said second metal ion layer, are obtained via said anisotropic IMP procedure, at a thickness between about 50 to 1000 Angstroms.

18. The method of claim 13, wherein said first anneal procedure, used to form said titanium disilicide layer, is performed at a temperature between about 600 to 900° C., in a conventional furnace or in a rapid thermal anneal furnace.

19. The method of claim 13, wherein said second anneal procedure, used to form said titanium nitride barrier layer, is performed in a conventional furnace, or an RTA furnace, at a temperature between about 600 to 900° C., in a nitrogen containing ambient comprised of either $N_2$, NO, $N_2O$, or $NH_3$.

20. The method of claim 13, wherein said tungsten plug structure is formed from a tungsten layer, obtained via LPCVD procedures at a thickness between about 1000 to 5000 Angstroms, then defined via a chemical mechanical polishing procedure, or via a selective RIE procedure, using $Cl_2$ or $SF_6$ as an etchant for tungsten.

* * * * *